(12) United States Patent
Kuwahara et al.

(10) Patent No.: US 6,344,612 B1
(45) Date of Patent: Feb. 5, 2002

(54) TERMINAL BOX DEVICE, AND A SOLAR PANEL AND TERMINAL BOX DEVICE ASSEMBLY

(75) Inventors: Masanori Kuwahara; Makoto Higashikozono, both of Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 09/416,890

(22) Filed: Oct. 13, 1999

(30) Foreign Application Priority Data

Oct. 29, 1998 (JP) .......................... 10-308137

(51) Int. Cl.[7] ................................ H02G 3/08
(52) U.S. Cl. ........................ 174/50; 174/59; 174/58; 220/3.3
(58) Field of Search ................. 174/50, 65 R, 174/53, 58, 59, 57, 60, 52.1; 220/3.2–3.8, 3.92, 3.94, 4.02

(56) References Cited

U.S. PATENT DOCUMENTS

| | | | |
|---|---|---|---|
| 1,620,047 A | * 3/1927 | Valkenburg | ............... 220/3.92 |
| 4,460,232 A | 7/1984 | Sotolongo | |
| 4,620,061 A | * 10/1986 | Appleton | ..................... 174/51 |
| 4,623,753 A | 11/1986 | Feldman et al. | |
| 4,654,470 A | * 3/1987 | Feldman et al. | ............... 174/50 |
| 5,914,460 A | * 6/1999 | Mowery et al. | ............... 174/50 |

FOREIGN PATENT DOCUMENTS

| | | |
|---|---|---|
| EP | 0 867 947 A2 | 9/1998 |
| JP | 62 054972 A | 10/1987 |
| JP | 09 312175 A | 2/1997 |
| JP | 9-223538 A | 8/1997 |
| JP | 9-312175 A | 12/1997 |
| JP | 10-135499 A | 5/1998 |
| WO | WO 93/12636 | 6/1993 |

* cited by examiner

*Primary Examiner*—Anthony Dinkins
*Assistant Examiner*—Angel R. Estrada
(74) *Attorney, Agent, or Firm*—Oliff & Berridge, PLC

(57) ABSTRACT

A terminal box device has a body unit and a cover unit. The cover unit has a cover member, terminal members and bypassing diodes. Cables lead into the cover member, and the cover member includes a filler which covers the end of the panel cables, part of the terminal members, and the bypassing diodes. The body unit has a casing including wiring holes, terminals, a waterproof seal installed on a groove formed along an upper surface of a peripheral wall of the casing, and waterproof walls surrounding each wiring hole. The terminal members and the terminals are electrically connected with each other by installing the cover unit on the body unit. The waterproof seal and the waterproof walls prevent water from penetrating into the body unit.

4 Claims, 10 Drawing Sheets

TERMINAL BOX DEVICE, AND A SOLAR PANEL AND TERMINAL BOX DEVICE ASSEMBLY

BACKGROUND OF THE INVENTION

1. Field of the Invention

The present invention relates to a terminal box device. It relates in particular to a terminal box device which can be easily electrically connected to a solar panel, such as a solar panel which can be installed on a roof (or the like) of a building for the generation of electricity. The invention further relates to an assembly including a terminal box device and a solar panel.

2. Description of the Prior Art

As illustrated in FIG. 8, it is known to provide a terminal box 1 on the rear surface of a solar panel 4. The solar panel 4 has a large number of solar cells 2 (designated collectively by the reference numeral 3). The solar cells 2 are electrically connected in series with one another. The solar cells are partitioned into groups, and each group of solar cells is connected in parallel with a respective bypassing rectification element (diode) accommodated inside the terminal box 1. The bypassing rectification elements ensure that even if a certain solar cell enters a state in which it ceases to conduct (e.g. because the solar cell is in the shade), it does not prevent the solar panel 4 generating a voltage (by the other groups of solar cells) because the respective bypassing rectification element shorts it out.

As shown in FIGS. 9 and 10, the terminal box 1 includes a terminal box body unit 6 and a plate-shaped cover 7 installed on the body unit 6. The body unit 6 is formed of a resin such as a plastics material. The body unit 6 includes a casing 8 having an upper surface (as viewed on FIG. 8) which defines an upwardly facing recess, and a bottom surface 16 which is rectangular. Four wiring holes 10a, 10b, 10c, 10d are arranged in a row on the bottom surface 16. Four terminals 11a, 11b, 11c, and 11d are arranged in a row at positions corresponding to the positions of the holes 11a, 10b, 10c, 10d. The terminals 11a, 11b, 11c, 11d are fixed to the casing 8 by respective screws 12a, 12b, 12c, 12d. Panel connection cables 5a and 5d are fixed to the terminals 11a and 11d, positioned at either end of the row of terminals 11a–11d, by respective screws 12a and 12d. The panel connection cables 5a and 5d lead out of the body unit 6 through two wiring holes 14a and 14d, respectively formed on a side surface 13 of the casing 8. Three bypass diodes 15 are soldered pairwise between the terminals 11a–11d, such that a respective bypass diode 15 is interposed between the terminals 11a and 11b, 11b and 11c, and 11c and 11d.

The terminal box body unit 6 is installed on the solar panel 4 as follows. The rear surface 16 of the casing 8 of the terminal box body unit 6 is positioned against a rear surface 17 of the solar panel 4; the ends of two output leads 18a and 18d (connected with cells 3 of the solar panel 4) provided on the rear surface 17 of the solar panel 4 are introduced into the casing 8 through the respective wiring holes 10a and 10d. Then, the two output leads 18a and 18d are soldered to the terminals 11a and 11d. To make the body unit waterproof and moisture-proof, to promote heat release and to prevent moisture condensation, the casing 8 is filled with silicone 19 such that the silicone 19 covers the bypass diodes 15, the terminals 11a–11d, and the sides of one end of each of the cables 5a and 5d. Finally, the cover 7 is installed on the casing 8 to cover the recess in the casing 8.

As shown in FIG. 11, the panel connection cable 5a of a terminal box 1 installed on a first solar panel 4 can be connected to the panel connection cable 5d of a terminal box 1 installed on another solar panel. In this manner, it is possible to connect in series a plurality of solar panels 4 which are arranged in a row on a roof or the like.

As shown in FIG. 12, to extract electric power from the solar panels 4, the solar panels 4 may be electrically connected in series with one another to construct a photo-voltaic system 21; and the solar panels connected with one another in series are connected with an inverter or a connection box 20 to extract electric power as alternating current.

The conventional terminal box 1 for a solar panel 4 is manufactured by a terminal box manufacturer without installing the cover 7 on the terminal box body unit 6. A solar panel assembly manufacturer installs the terminal box body unit 6 on the solar panel 4, fills the casing 8 with silicone, and finally installs the cover 7 on the terminal box body unit 6. In this manner, the terminal box 1 for the solar panel 4 is completed.

As described above, in installing the terminal box 1 on the solar panel 4, it is necessary for the manufacturer of the solar panel to fill casing 8 with the silicone 19. This is done when the terminal box body unit 6 is already installed on the solar panel 4. Thus, an operator must perform a difficult silicone-filling operation including many steps. This results in poor operation efficiency, and so prevents the manufacturing cost of the photo-voltaic system from being reduced.

Further, if a bypass diode 15 of the terminal box 1 installed on the solar panel 4 is damaged during use, the bypass diode 15 cannot be replaced individually on the spot. Instead the whole of the terminal box 1 and solar panel 4 must be replaced with a new terminal box 1 and a new solar panel 4. This increases maintenance cost, and also prevents the manufacturing cost of the photo-voltaic system from being reduced.

SUMMARY OF THE INVENTION

The present invention has been made in view of the above-described problems. The present invention aims to provide a new and useful terminal box device for a solar panel, and in particular an inexpensive terminal box device which can be easily installed on a solar panel while still being adequately waterproof, and which can be maintained at reduced cost.

In general terms, the present invention proposes that a terminal box has a body unit and a cover unit which can be fastened to each other. The cover unit contains the rectification elements and electrical connections which lead outside the terminal box. It is filled with a filler. The body unit can be mounted on the solar panel and provides connections to the solar cells of the solar panel.

Specifically, in a first aspect the present invention provides a terminal box device for a solar panel, comprising a body unit and a cover unit;

said body unit comprising:
  a casing, the casing defining a recess and having an attachment surface for attachment to the solar panel, and
  a plurality of terminals for connection to photoelectric conversion elements of a solar panel, said terminals being fixedly accommodated in said casing;

said cover unit comprising:
  a cover member defining a chamber,
  a plurality of terminal members, said terminal members being fixedly accommodated in said chamber,
  a plurality of cables, said cables being connected with respective said terminal members, a plurality of bypassing rectification elements, said bypassing rectification elements each being electrically connected to a respective pair of said terminal members, and a filler, the filler in said chamber which covers said bypassing rectification elements, a part of each of said terminal member being exposed;

said cover unit being removably fastenable in a location on said body unit in which said recess faces said chamber; and said terminal members and said terminals being arranged in corresponding respective positions, whereby, when said cover unit is fastened in said location on said body unit, said terminal members and said terminals are electrically connected with each other.

Due to this construction, a terminal box manufacturer can manufacture the body unit and the cover unit, including the step of filling the cover unit with filler, and deliver them to a manufacturer of solar panels. The solar manufacturer connects the output leads of a solar panel with the respective terminals of the body unit, and installs the cover unit on the body unit. Thus, the assembly process if simplified, by comparison to the known assembly process described above.

Furthermore, if a bypassing rectification element of the terminal box device is damaged during use, the terminal box device can be repaired by replacing the cover unit only. Thus, unlike the known assembly described above, there is no need to replace the solar panel.

Preferably, said plurality of bypassing rectification elements are electrically connected to a respective pair of said terminal members which are adjacent.

Preferably, a plurality of wiring holes are formed in said attachment surface in positions corresponding to the positions of respective said terminals;

and said body unit includes a plurality of waterproof walls, each of said waterproof walls surrounding a respective one of said terminals and a respective one of said wiring holes, each of said waterproof walls having an upper surface which, when said cover unit is fastened in said location to the body unit, closely contacts a surface of said filler, whereby a watertight connection is made. The waterproof walls effectively prevent water from penetrating into the bypassing rectification elements.

Preferably, a waterproof seal is provided on at least one of (i) a peripheral part of said casing encircling said recess and (ii) a peripheral part of said cover member encircling said chamber, whereby, when said cover unit is fastened in said location to the body unit, said waterproof seal is interposed between said cover member and said body unit and constitutes a waterproof seal encircling said recess and said chamber.

Preferably, each of the terminal members has a fixing portion fixed to an inner surface of said cover member and covered with said filler, and a connection portion projecting out of said filler; and each of said terminals has a fixing portion fixed to an inner part of said recess, and a connection portion projecting from said casing, said connection portion of each terminal member being electrically connected to the connection portion of the respective said terminal when said cover unit is fastened in said location to the body unit.

Preferably, the connecting portion of each terminal includes erect portions and when said cover is fastened in said location to the body unit, the connection portion of each terminal member is received in a gap between said erect portions of said respective terminal. Thus, the connection portion of each terminal is connected to the connection portion of the respective terminal member merely by installing the cover unit on the body unit. Therefore, assembly is very much simplified by comparison to the known terminal box described above.

In a second aspect, the present invention provides an assembly comprising a terminal box device and a solar panel, the solar panel having at least one photoelectric conversion element;

the terminal box device comprising a body unit and a cover unit;

said body unit comprising:
a casing, the casing defining a recess and having an attachment surface attached to the solar panel, and
a plurality of terminals electrically connected to said photoelectric conversion elements, said terminals being fixedly accommodated in said casing;

said cover unit comprising:
a cover member defining a chamber,
a plurality of terminal members, said terminal members being fixedly accommodated in said chamber,
a plurality of panel connection cables, said panel connection cables being connected with respective said terminal members and extending out of said cover member,
a plurality of bypassing rectification elements, said bypassing rectification elements each being electrically connected to a respective adjacent pair of said terminal members, and
a filler, said filler filling said chamber and covering said bypassing rectification elements, a part of each of said terminal member being exposed;

said cover unit being removably fastened in a location on said body unit in which said recess faces said chamber; and said terminal members and said terminals being arranged in corresponding respective positions, whereby, when said cover unit is fastened in said location on said body unit, said terminal members and said terminals are electrically connected with each other.

DETAILED DESCRIPTION OF PREFERRED EMBODIMENTS

A first embodiment of the present invention will be described below with reference to FIGS. 1 to 7.

The terminal box device of the embodiment has a cover unit 100 and a body unit 200. The cover unit 100 contains bypassing rectification elements 103 in parallel with photo-electric conversion elements (not shown) (for example each photoelectric conversion element may be a group of one or more solar cells) installed on the surface of the solar panel. The rectification elements of the terminal box short out the respective photoelectric conversion element by bypassing it when the voltage across it is outside a given range (for example, when its resistance is high because the element is in the shade).

Figure 1:
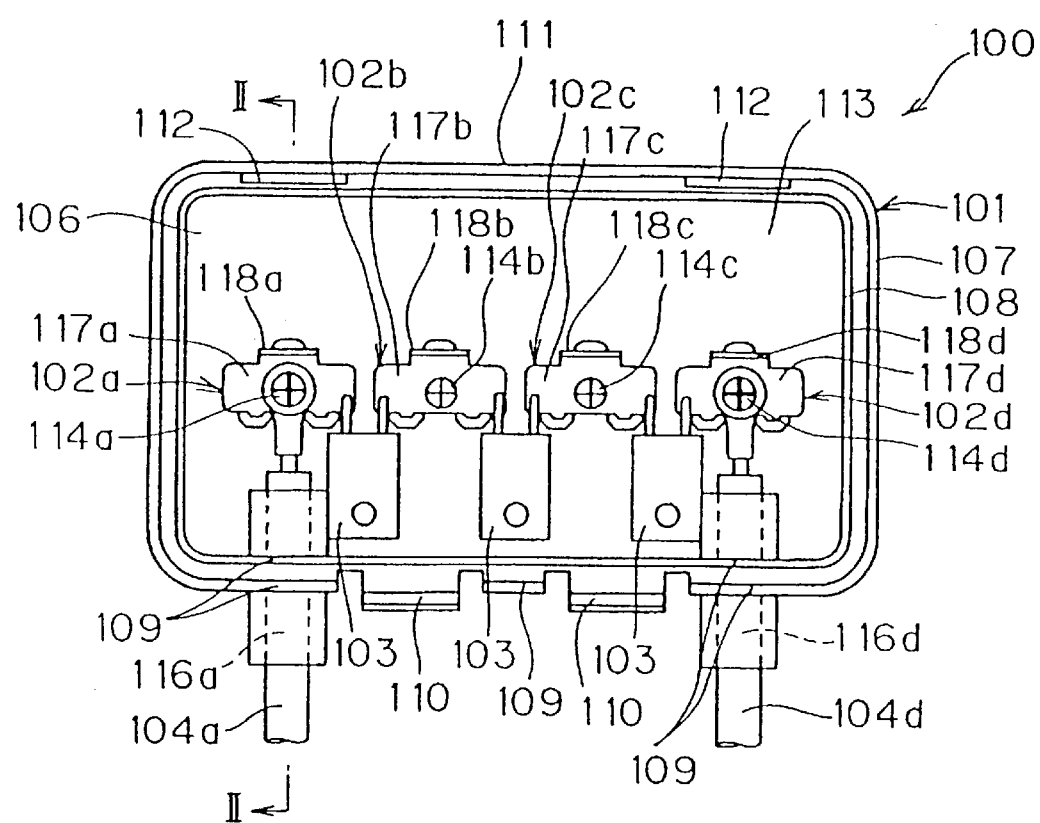
FIG. 1 is a bottom view showing a cover unit according to a first embodiment of the present invention.
Figure 2:
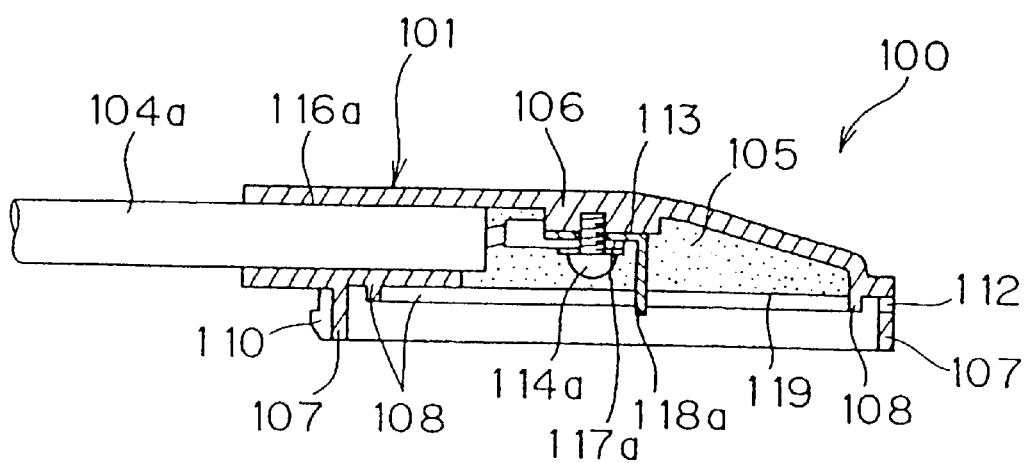
FIG. 2 is sectional view taken along a line II—II of FIG. 1.

FIG. 1 is a bottom view showing the cover unit 100. FIG. 2 is a sectional view taken along a line II—II of FIG. 1. FIG. 1 is as seen from below on FIG. 2.

As shown in FIGS. 1 and 2, the cover unit 100 has a cover member 101; four terminal members 102a, 102b, 102c, 102d (which may be plate-shaped, i.e. flat); three bypassing rectification elements 103 such as bypass diodes; two panel connection cables 104a, 104d, and a filler 105 such as silicone.

The cover member 101 is formed of an electrically insulating material such as a plastics material. For example, the cover member 101 may be formed of modified PPO (polyphenylene oxide), also called modified PPE. The cover member 101 defines a downwardly facing chamber, and its upper part 106 is rectangular (as seen in plan view). As shown in FIG. 5A, a wall 108 is formed along the inner side of a peripheral wall 107 of the cover member 101. First locking claws 110 are formed on one longer side wall 109 of the peripheral wall 107. Claw-receiving holes 112 are formed on the other longer side wall 111 of the peripheral wall 107.

The four terminal members 102a–102d are fixed to the inner surface 113 of the upper part 106 of the cover member 101 with screws 114a, 114b, 114c, 114d, respectively. The bypassing rectification elements 103 are soldered to the terminal members 102a–102d such that each of the bypassing rectification elements 103 is interposed between two adjacent terminal members 102a–102d. Panel connection cables 104a, 104d are fixed to the terminal members 102a, 102d respectively, with the screws 114a, 114d respectively. The panel connection cables 104a, 104d extend outwardly from two respective cylindrical wiring holes 116a, 116d formed on the side wall 109 of the cover member 101. The diameter of each of the wiring holes 116a, 116d is large enough to allow the panel connection cables 104a, 104d to be inserted therethrough.

The terminal members 102a–102d are all formed of electrically conductive material. As shown in FIG. 6A, the terminal members 102a–102d have respective fixing portions 117a, 117b, 117c, 117d which are fixed to the inner surface 113 of the cover member 101 and to which the bypassing rectification elements 103 are soldered; and connection portions 118a, 118b, 118c, 118d integral with the fixing portions 117a, 117b, 117c, 117d and upstanding from an edge of each of the fixing portions 117a, 117b, 117c, 117d.

As shown in FIG. 2, the filler 105 fills the chamber defined by the cover member 101 to cover the bypassing rectification elements 103; the respective end portions of the panel connection cables 104a, 104d; and the fixing portions 117a, 117b, 117c, 117d. A front end of each of the connection portions 118a, 118d projects out of the filler 105.

Figure 3:
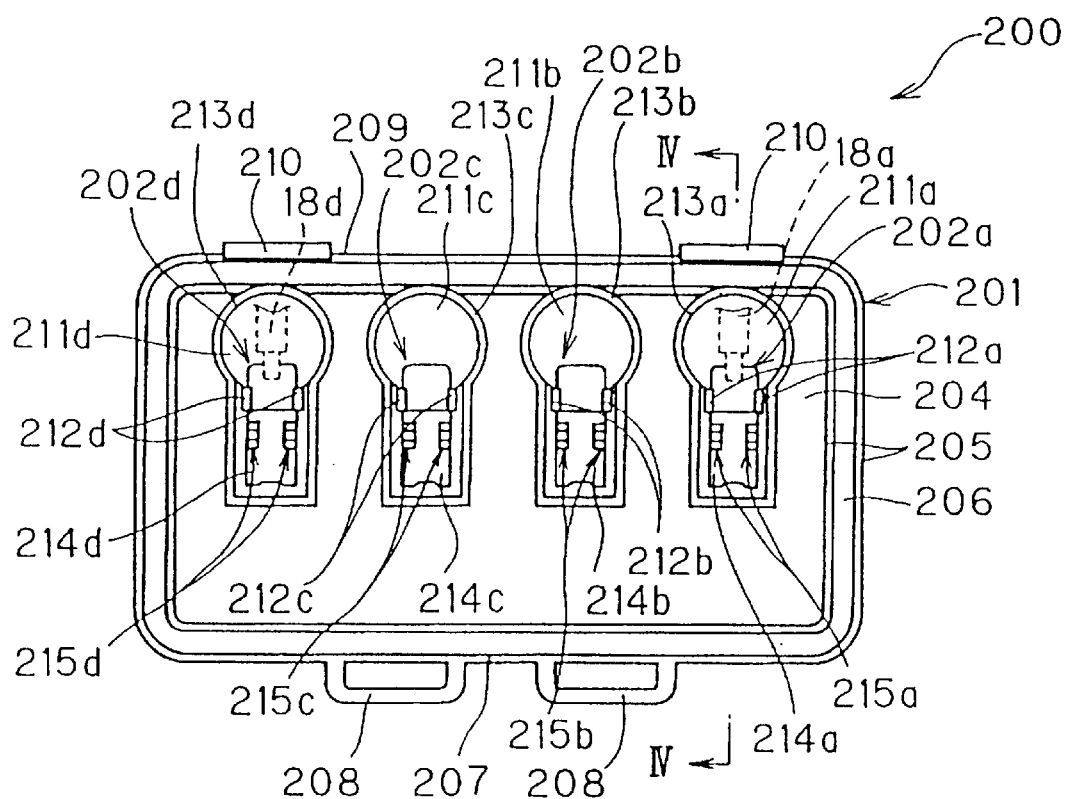
FIG. 3 is a plan view showing a body unit according to the first embodiment of the present invention.
Figure 4:
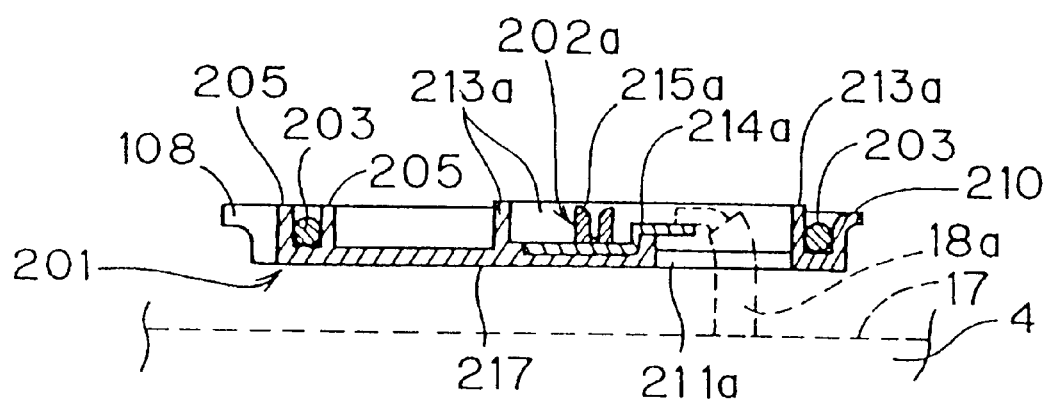
FIG. 4 is sectional view taken along a line IV—IV of FIG. 3.
Figure 5:
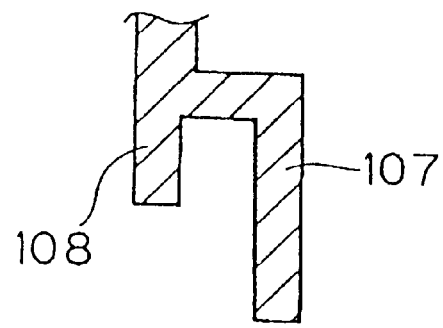
FIG. 5A is a sectional view showing a wall of a cover member of the first embodiment of the present invention.
FIG. 5B is a sectional view showing a groove of a casing of the body unit.
FIG. 5C is a sectional view illustrating the engagement between the wall of the cover member and the groove of the casing of the body unit.
Figure 5:
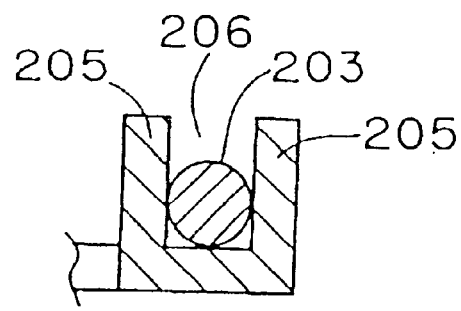
Figure 5:
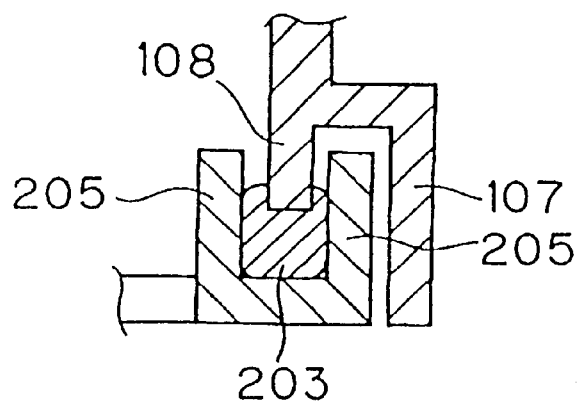
Figure 6:
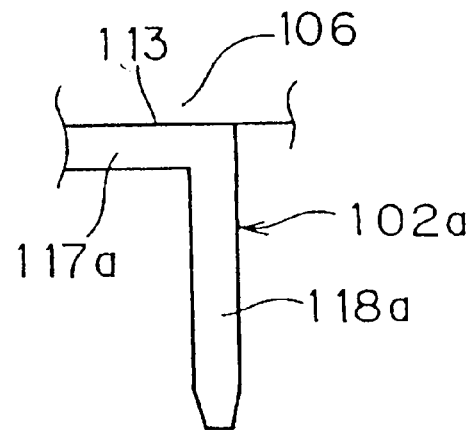
FIG. 6A is a side view showing a connection portion of the cover unit of the first embodiment of the present invention.
FIG. 6B is a side view showing a connection portion of the body unit of the first embodiment of the present invention.
FIG. 6C is a side view showing the connection between the respective connection portions of the body unit and cover unit.
Figure 6:
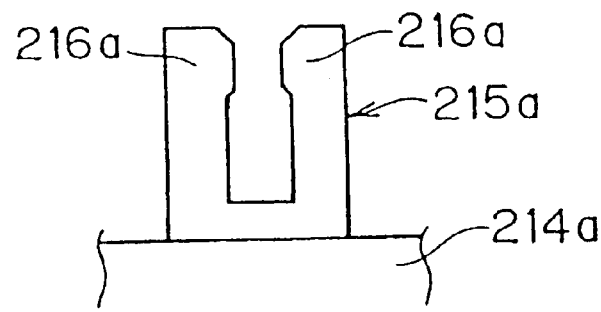
Figure 6:
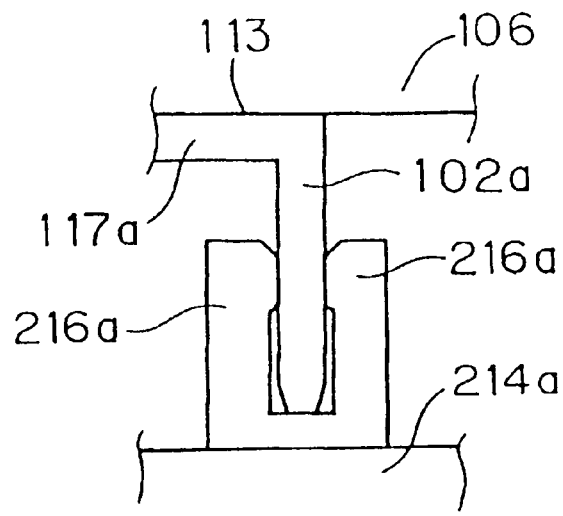

FIG. 3 is a plan view showing the body unit 200. FIG. 4 is sectional view taken along a line IV—IV of FIG. 3.

As shown in FIGS. 3 and 4, the body unit 200 has a casing 201; four terminals 202a, 202b, 202c, 202d; and a waterproof seal 203.

The casing 201 is formed of electrically insulating material such as a plastics material. For example, the casing 201 may be formed of modified PPO (polyphenylene oxide). The upper part of the casing 201 (as seen in FIG. 4) defines an open recess and its lower part 204 is rectangular (as seen in plan view).

Figure 7:
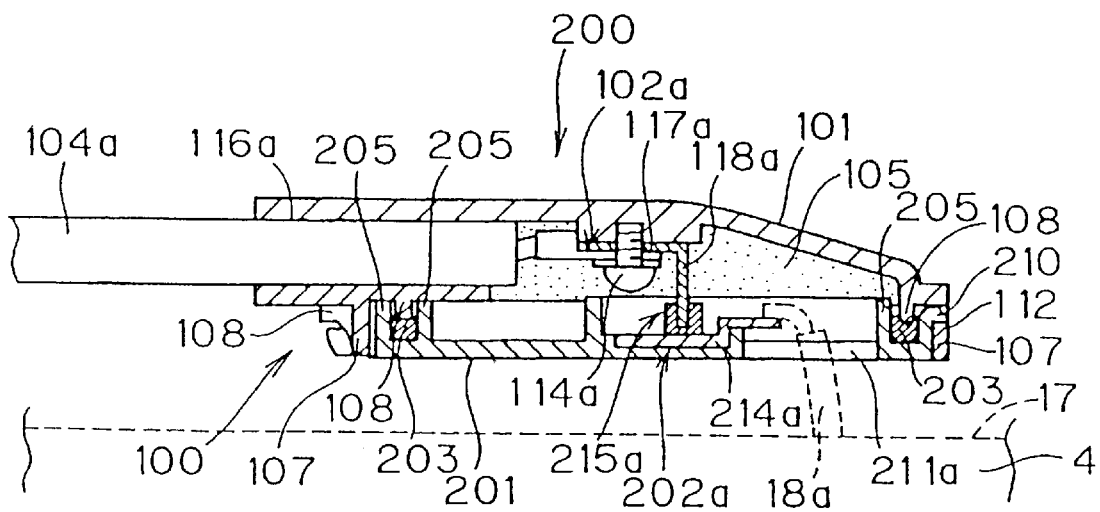
FIG. 7 is a sectional view showing a state in which the cover unit of the first embodiment has been installed on the body unit of the first embodiment.
Figure 8:
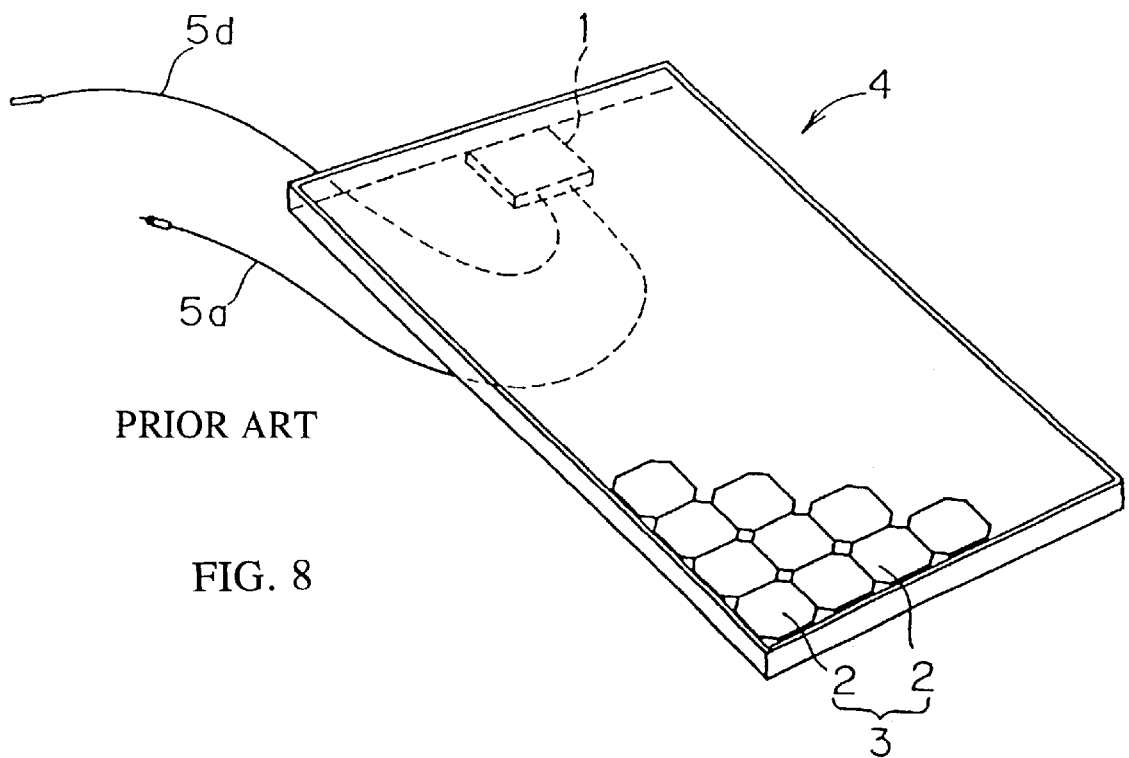
FIG. 8 is a perspective view showing a conventional solar panel.

As shown in FIG. 5B, a groove 206 is continuously formed along the upper surface of a peripheral wall 205 of the casing 201. The waterproof seal 203 is installed in the groove 206. As shown in FIGS. 5C and 7, when the cover unit 100 is installed on the body unit 200 with the recess facing and communicating with the chamber, the wall 108 located along the inner side of the peripheral wall 107 of the cover member 101 is inserted into the groove 206 formed on the peripheral wall 205 of the casing 201, and makes a waterproof sealing connection with the waterproof seal 203. In this manner, water is prevented from penetrating into the gap between the peripheral wall 107 and the peripheral wall 205.

Two second claw-receiving holes 208 for removably receiving respective first locking claws 110 are formed on a longer side wall 207 of the peripheral wall 205 of the casing 201. Second locking claws 210, for removable insertion into respective first claw-receiving holes 112, are formed on a longer side wall 209 opposed to the side wall 207. After the second locking claws 210 are locked into the respective first claw-receiving holes 112, the first locking claws 110 are locked to the respective second claw-receiving holes 208 by pressing the former against the latter. This completes the installation of the cover unit 100 on the body unit 200.

Four wiring holes 211a, 211b, 211c, 211d are formed on the bottom part 204 of the casing 201. The four terminals 202a, 202b, 202c, 202d are located at positions corresponding to the positions of the wiring holes 211a, 211b, 211c, 211d respectively, and fixed to the bottom part 204 with locking claws 212a, 212b, 212c, 212d respectively. Waterproof walls 213a, 213b, 213c, 213d integral with the bottom part 204 stand up from the bottom part 204 such that the waterproof walls 213a, 213b, 213c, 213d surround the respective terminals 202a, 202b, 202c, 202d and the respective wiring holes 211a, 211b, 211c, 211d. When the cover unit 100 is installed on the body unit 200, the upper surface of each of the waterproof walls 213a–213d closely contacts the lower surface 119 (see FIG. 2) of the filler 105, thus preventing water from penetrating into the gap between the lower surface 119 and the upper surfaces of the waterproof walls 213a–213d.

The terminals 202a–202d are all formed of an electrically conductive material. The terminals 202a–202a have fixing portions 214a, 214b, 214c, 214d fixed to the bottom part 204 of the casing 201; and connection portions 215a, 215b, 215c, 215d integral with the respective fixing portions 214a, 214b, 214c, 214d and upstanding therefrom.

As shown in FIG. 6B, the connection portions 215a, 215b, 215c, 215d each have two respective erect portions 216a, 216b, 216c, 216d upstanding from the respective fixing portions 214a, 214b, 214c, 214d, with a predetermined gap provided between the two erect portions. As shown in FIG. 6C, when the cover unit 100 is installed on the body unit 200, each of the connection portions 215a–215d of the terminals is electrically connected with an end of the respective connection portion 118a–118d of the respective terminal member.

With the installing surface 217 of the body unit 200 facing the rear surface of 17 of the solar panel 4, each of the fixing portions 214a, 214b, 214c, 214d is connected with output leads 18a, 18b, 18c, 18d provided on the rear surface 17 of the solar panel 4. Each lead may be a wire covered with an insulating layer. The output leads 18a, 18b, 18c, 18d are introduced into the wiring holes 211a, 211b, 211c, 211d to connect them with the fixing portions 214a, 214b, 214c, 214d respectively. The end portions of the output leads 18a, 18b, 18c, and 18d may be flattened to facilitate this connection.

In the embodiment shown, the panel has four output leads 18a, 18b, 18c and 18d. However, the number of leads may be different in other embodiments of the invention, since different suppliers of solar panels include a different number of leads. The cover unit 100 and body unit 200 of this embodiment are suitable for use with solar panels having up to four leads, but if they are used in conjunction with a solar panel having fewer leads (e.g. only two leads), these leads may be attached to respective ones of the four fixing portions 214a, 214b, 214c, 214d. For example, if there are only two leads, they may be attached to fixing portions 214a and 214b respectively. Optionally, in this case the diodes between fixing portions 214b and 214c, and 214c and 214d may be shorted out.

A terminal box manufacturer manufactures the cover unit 100 and the body unit 200 and delivers them to a solar panel assembly manufacturer. The solar panel assembly manufacturer installs the body unit 200 on the solar panel 4; connects the output leads 18a–18d with the fixing portions 214a–214b of the terminals 202a–202d respectively; locks the second locking claws 210 into the first claw-receiving holes 112, and the first locking claws 110 into the second claw-receiving holes 208 by pressing the former against the latter. In this manner, the cover unit 100 is installed on the body unit 200. Consequently, the connection portions 118a–118d are connected with the connection portions 215a–215d, respectively; the upper surface of each of the waterproof walls 213a–213d contacts the lower surface 119 of the filler 105, thus sealing the walls 213a–213d to the filler 105 in a waterproof manner; and the wall 108 is pressed against the waterproof seal 203 to make the waterproof seal 203 seal the gap between the peripheral wall 107 and the peripheral wall 205.

Figure 9:
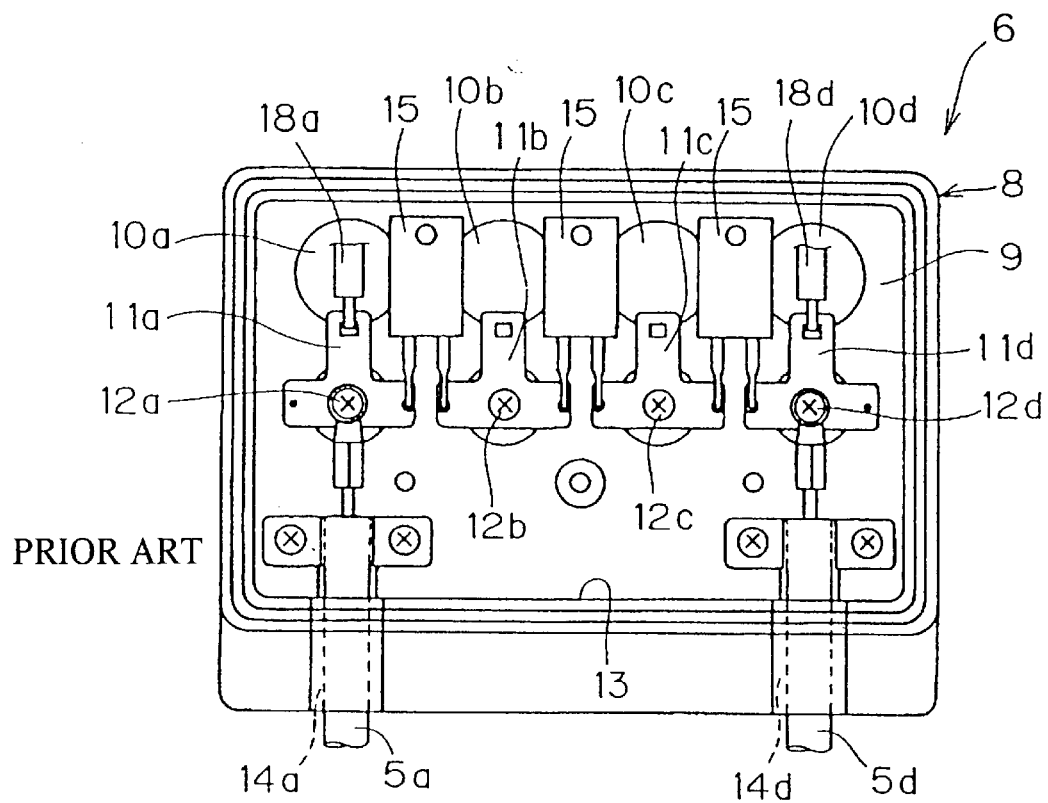
FIG. 9 is a plan view showing a conventional body casing.
Figure 10:
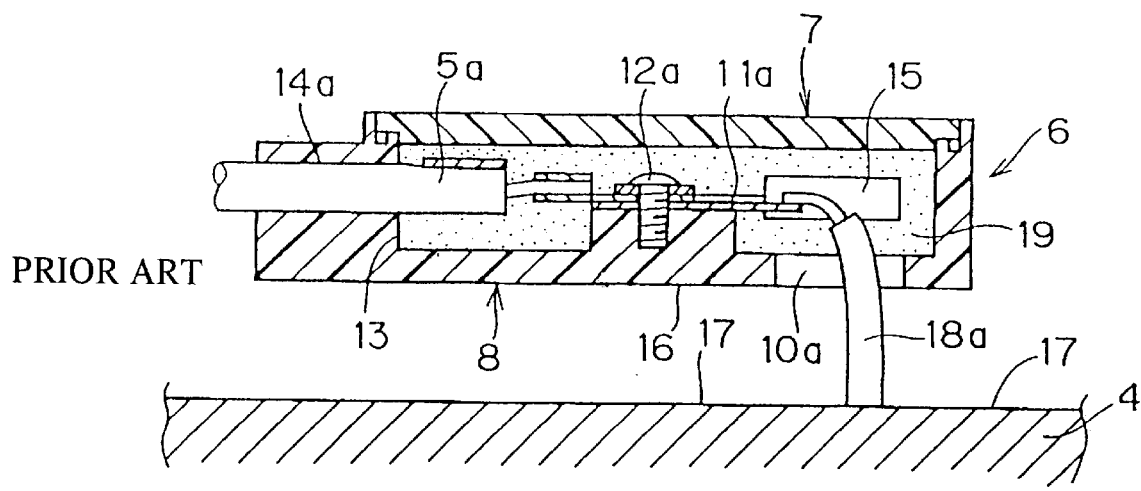
FIG. 10 is a sectional view showing a conventional terminal box.
Figure 11:
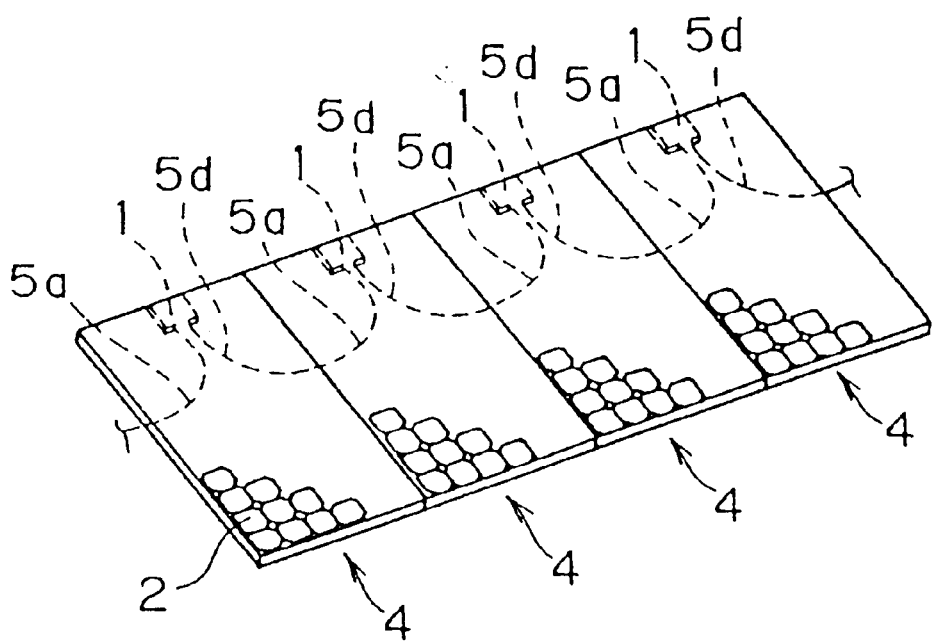
FIG. 11 shows a conventional way of connecting solar panels.
Figure 12:
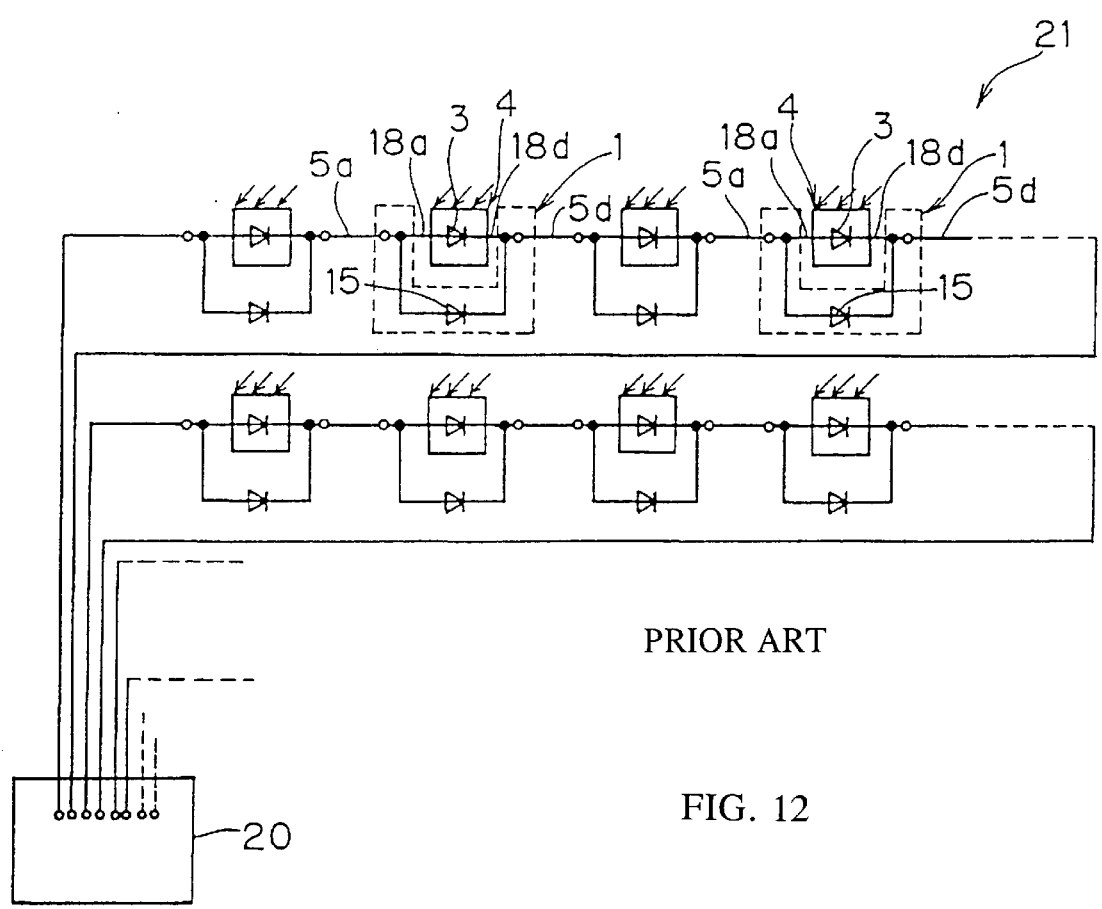
FIG. 12 is a block diagram showing a conventional photo-voltaic system.

When the terminal box manufacturer delivers the terminal box device to the solar panel assembly manufacturer, the chamber in the cover 100 is already filled with filler 105. Thus, unlike the conventional terminal box device shown in FIGS. 9 and 10, the present invention eliminates the need for filling silicone into the casing 8 after connecting the output leads 18a–18d with the terminals 11a–11d respectively. That is, it is very easy to install the terminal box device on the solar panel 4 and thus reduce the manufacturing cost of the solar panel 4.

Furthermore, if a bypassing rectification element 103 of the terminal box device is damaged during use, the solar panel assembly can be repaired by replacing only the cover body 100. This greatly reduces the cost of maintaining the terminal box device.

Although the invention has been described above in relation to particular embodiments, many variations are possible within the spirit and scope of the invention herein described, as will be clear to those skilled in the art.

What is claimed is:

1. A terminal box device for a solar panel, comprising a body unit and a cover unit;

said body unit comprising:
a casing, the casing defining a recess and having an attachment surface for attachment to the solar panel, wherein said attachment surface comprises a plurality of wiring holes formed in positions corresponding to the positions of respective terminals,
a plurality of terminals for connection to photoelectric conversion elements of the solar panel, said terminals being fixedly accommodated in said casing, and
a plurality of waterproof walls, each of said waterproof walls surrounding a respective one of said terminals and a respective one of said wiring holes, each of said waterproof walls having an upper surface which, when said cover unit is fastened in said location to the body unit, closely contacts a surface of a filler, whereby a watertight connection is made, said cover unit comprising:
a cover member defining a chamber,
a plurality of terminal members, said terminal members being fixedly accommodated in said chamber,
a plurality of cables, said cables being connected with respective said terminal members and extending out of said cover member,
a plurality of bypassing rectification elements, said bypassing rectification elements each being electrically connected to a respective pair of said terminal members, and
the filler being in said chamber and covering said bypassing rectification elements, at least a part of each of said terminal members being exposed;
said cover unit being removably fastenable in a location on said body unit in which said recess faces said chamber; and
said terminal members and said terminals being arranged in corresponding respective positions, whereby, when said cover unit is fastened in said location on said body unit, said terminal members and said terminals are respectively electrically connected with each other.

2. A terminal box device according to claim 1, wherein a waterproof seal is provided on at least one of (i) a peripheral part of said casing encircling said recess and (ii) a peripheral part of said cover unit is fastened in said location to the body unit, said waterproof seal is interposed between said cover member and said body unit and constitutes a waterproof seal encircling said recess and said chamber.

3. A terminal box device according to claim 1, wherein:

each of said terminal members has a fixing portion fixed to an inner surface of said cover member and covered with said filler, and a connection portion projecting out of said filler; and each of said terminals has a fixing portion fixed to an inner part of said recess, and a connection portion projecting from said fixing portion, said connection portion of each terminal member being electrically connected to the connection portion of the respective said terminal when said cover unit is fastened in said location to the body unit.

4. A terminal box device for a solar panel, comprising a body unit and a cover unit;

said body unit comprising:
 a casing, the casing defining a recess and having an attachment surface for attachment to the solar panel and
 a plurality of terminals for connection to photoelectric conversion elements of the solar panel, said terminals being fixedly accommodated in said casing;

said cover unit comprising:
 a cover member defining a chamber,
 a plurality of terminal members, said terminal members being fixedly accommodated in said chamber,
 each of said terminal members has a fixing portion fixed to an inner surface of said cover member and covered with a filler, and a connection portion projecting out of said filler; and
 each of said terminals has a fixing portion fixed to an inner part of said recess, and a connection portion projecting from said fixing portion, said connection portion of each terminal member being electrically connected to the connection portion of the respective said terminal when said cover unit is fastened in said location to the body unit, wherein the connection portion of each terminal includes erect portions and when said cover unit is fastened in said location to the body unit, the connection portion of each terminal member is received in a gap between said erect portions of said respective terminal, a plurality of cables, said cables being connected with respective said terminal members and extending out of said cover member, a plurality of bypassing rectification elements, said bypassing rectification elements each being electrically connected to a respective pair of said terminal members, and said filler being in said chamber and covering said bypassing rectification elements, at least a part of each of said terminal members being exposed;

said cover unit being removably fastenable in a location on said body unit in which said recess faces said chamber; and said terminal members and said terminals being arranged in corresponding respective positions, whereby, when said cover unit is fastened in said location on said body unit, said terminal members and said terminals are respectively electrically connected with each other.

* * * * *